(12) United States Patent
Fukui et al.

(10) Patent No.: US 12,214,426 B1
(45) Date of Patent: Feb. 4, 2025

(54) CUTTING TOOL

(71) Applicant: Sumitomo Electric Industries, Ltd., Osaka (JP)

(72) Inventors: Haruyo Fukui, Osaka (JP); Nozomi Tsukihara, Osaka (JP); Toshihiro Tabata, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/723,483

(22) PCT Filed: Nov. 29, 2023

(86) PCT No.: PCT/JP2023/042711
§ 371 (c)(1),
(2) Date: Jun. 24, 2024

(51) Int. Cl.
*B23B 27/14* (2006.01)
*C23C 14/02* (2006.01)
*C23C 14/06* (2006.01)
*C23C 14/32* (2006.01)

(52) U.S. Cl.
CPC .......... *B23B 27/148* (2013.01); *C23C 14/024* (2013.01); *C23C 14/0641* (2013.01); *C23C 14/0676* (2013.01); *C23C 14/325* (2013.01); *B23B 2228/105* (2013.01)

(58) Field of Classification Search
CPC ............. C23C 14/0641; C23C 14/0617; Y10T 428/12493–428/12986; B23B 1/00–2270/62
See application file for complete search history.

(56) References Cited

FOREIGN PATENT DOCUMENTS

| | | |
|---|---|---|
| JP | 2018-202533 A | 12/2018 |
| JP | 2019-199647 A | 11/2019 |
| JP | 2021-139009 A | 9/2021 |
| JP | 2022-143690 A | 10/2022 |
| WO | 2009/025112 A1 | 2/2009 |

OTHER PUBLICATIONS

Chauhan et al. "A review paper on tribological and mechanical properties of ternary nitride based coatings", Procedia Technology, 14, (2014); pp. 430-437.*
Grigoriev et al. Influence of Mo content on the properties of multilayer nanostructured coatings based on the (Mo, Cr, Al)N system, Tribology International, 174, (2022); pp. 107741-1 to 107741-15.*
Written Opinion and International Search Report mailed on Jan. 30, 2024, received for PCT Application No. PCT/JP2023/042711, filed on Nov. 29, 2023, 13 pages including English Translation.

* cited by examiner

*Primary Examiner* — Prashant J Khatri
(74) *Attorney, Agent, or Firm* — XSENSUS LLP

(57) ABSTRACT

A cutting tool, including: a base; and a coating disposed on the base, wherein the coating includes a first layer, the first layer is composed of an alternate layer in which a first unit layer and a second unit layer are alternately stacked, the first unit layer is composed of $Ti_{1-a}Mo_aN$, a represents 0.01 or more and 0.20 or less, the second unit layer is composed of $Al_bCr_{1-b}N$, and b represents 0.40 or more and 0.80 or less.

8 Claims, 7 Drawing Sheets

CUTTING TOOL

CROSS-REFERENCE TO RELATED APPLICATION

The present application is based on PCT/JP2023/042711, filed Nov. 29, 2023, the entire contents of which are incorporated herein by reference.

TECHNICAL FIELD

The present disclosure relates to a cutting tool.

BACKGROUND ART

A cutting tool comprising a base and a coating disposed on the base has been conventionally used for cutting processing (PTL 1).

CITATION LIST

Patent Literature

PTL 1: Japanese Patent Laying-Open No. 2022-143690

SUMMARY OF INVENTION

A cutting tool according to the present disclosure is a cutting tool comprising:
a base; and
a coating disposed on the base, wherein
the coating includes a first layer,
the first layer is composed of an alternate layer in which a first unit layer and a second unit layer are alternately stacked,
the first unit layer is composed of $Ti_{1-a}Mo_aN$,
a represents 0.01 or more and 0.20 or less,
the second unit layer is composed of $Al_bCr_{1-b}N$, and
b represents 0.40 or more and 0.80 or less.

DETAILED DESCRIPTION

Figure 1:
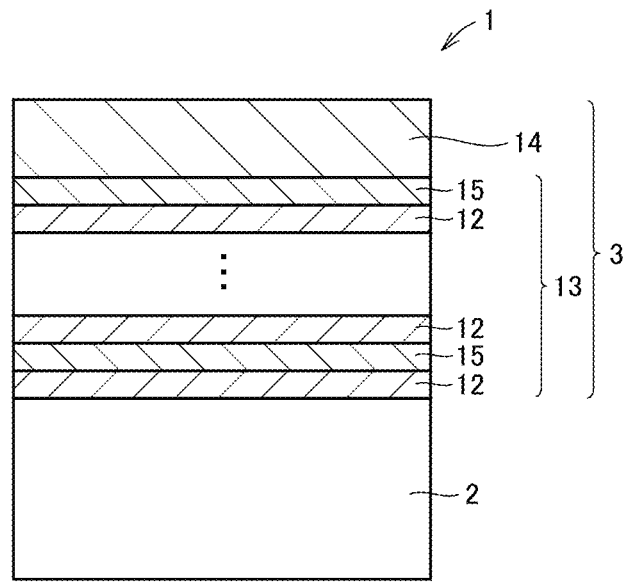
FIG. 1 is a schematic enlarged cross-sectional view of an example of a cutting tool according to Embodiment 1.

Problem to be Solved by the Present Disclosure

In recent years, efforts toward carbon neutrality has been accelerated domestically and overseas against the background of drastic global warming. In Japan, in order to achieve carbon neutrality in 2050, reduction in $CO_2$ emission from the viewpoints of environmental performance in addition to conventional quality, processing efficiency, and cost has been required in manufacturing industry, specifically in metal processing industry.

In steps of metal cutting process, most of electric power is consumed in operation preparation and circulation, supply, and the like of a coolant (oil agent for cutting) that use a pneumatic or hydraulic unit and auxiliary machinery as a main component rather than spindle rotation and feeding driving of a processing machine in processing. Thus, the effort for energy saving includes adopting a hydraulic unit for controlling an inverter and optimally controlling operation of pneumatic or hydraulic operation, a tip conveyor (conveying cutting tip) in addition to improving efficiency of a motor, auxiliary machinery, and the like. Further, a coolant-less technique (dry processing) or a semi-dry technique of forming the coolant into mist have attracted attention in recent years. These techniques can attempt to reduce waste due to reduction in the coolant and to save energy of electric power required for using the coolant. Therefore, it has been expected to develop these techniques that contributes to energy saving.

As for the dry processing, there have conventionally been studies to apply cutting tools and find an optimal processing condition for each of workpiece, and nonferrous metals, cast iron, and the like may be dry-processed. Meanwhile, dry processing is highly needed for workpiece called a hard-to-cut material, such as general steel materials and superalloys, but the dry processing is still in difficult situation at present. Novel tool materials dealing therewith have been actively developed.

As a coating material for a tool, a nitride film that contains Al and Cr as main components is proposed (PTL 1). A temperature on a cutting edge of the cutting tool during cutting tends to be high because: dry processing without a cutting oil agent is required from the viewpoint of reduction in $CO_2$ and global environment conservation; a cutting rate becomes higher for improvement of cutting efficiency; and workpiece becomes diverse, specifically, cutting a so-called hard-to-cut material such as heat-resistant alloy and titanium alloy increases in the aircraft field and the medical field. When the temperature on the cutting edge becomes high, the lifetime of the cutting tool becomes considerably short. Therefore, a cutting tool that can exhibit excellent tool lifetime even under such severe cutting conditions is required.

Advantageous Effect of the Present Disclosure

According to the present disclosure, the cutting tool that has a long tool lifetime even in cutting processing performed particularly under conditions of a high temperature on the cutting edge can be provided.

DESCRIPTION OF EMBODIMENTS

First, aspects of the present disclosure will be listed and described.

(1) A cutting tool according to the present disclosure is a cutting tool comprising:
a base; and
a coating disposed on the base, wherein
the coating includes a first layer,
the first layer is composed of an alternate layer in which a first unit layer and a
second unit layer are alternately stacked,
the first unit layer is composed of $Ti_{1-a}Mo_aN$,
a represents 0.01 or more and 0.20 or less,
the second unit layer is composed of $Al_bCr_{1-b}N$, and
b represents 0.40 or more and 0.80 or less.

According to the present disclosure, the cutting tool that has a long tool lifetime even in cutting processing performed particularly under conditions of a high temperature on the cutting edge can be provided.

(2) According to the (1), in the first unit layer and the second unit layer adjacent to the first unit layer, a ratio $\lambda 2/\lambda 1$ of a thickness $\lambda 2$ μm of the second unit layer to a thickness $\lambda 1$ μm of the first unit layer may be 1.0 or more and 5.0 or less. According to this, the cutting tool can have a longer tool lifetime.

(3) According to the (1) or (2),
an average thickness of the first unit layer may be 0.002 μm or more and 0.2 μm or less, and
an average thickness of the second unit layer may be 0.002 μm or more and 0.2 μm or less.

According to this, the cutting tool can have a longer tool lifetime.

(4) According to any of the (1) to (3),
the coating may further include a surface layer provided on a side opposite to the base of the first layer, and
the surface layer may be composed of TiMoON or AlCrON.

According to this, the cutting tool can have a longer tool lifetime.

(5) A cutting tool of the present disclosure is a cutting tool comprising:
a base; and
a coating disposed on the base, wherein
the coating includes a second layer,
the second layer is composed of an alternate layer in which a first unit layer and a third unit layer are alternately stacked,
the first unit layer is composed of $Ti_{1-a}Mo_aN$,
a represents 0.01 or more and 0.20 or less,
the third unit layer is composed of $Al_cCr_{1-c-d}X_dN$,
X represents one or two selected from the group consisting of boron, silicon, scandium, yttrium, and cerium,
c represents 0.40 or more and 0.80 or less, and
d represents 0.001 or more and 0.05 or less.

According to the present disclosure, the cutting tool that has a long tool lifetime even in cutting processing performed particularly under conditions of a high temperature on the cutting edge can be provided.

(6) According to the (5), in the first unit layer and the third unit layer adjacent to the first unit layer, a ratio $\lambda 3/\lambda 1$ of a thickness $\lambda 3$ μm of the third unit layer to a thickness 1 μm of the first unit layer may be 1.0 or more and 5.0 or less. According to this, the cutting tool can have a longer tool lifetime.

(7) According to the (5) or (6),
an average thickness of the first unit layers may be 0.002 μm or more and 0.2 μm or less, and
an average thickness of the third unit layers may be 0.002 μm or more and 0.2 μm or less.

According to this, the cutting tool can have a longer tool lifetime.

(8) According to any of the (5) to (7),
the coating may further include a surface layer provided on a side opposite to the base of the second layer,
the surface layer may be composed of TiMoON or AlCrXON, and
X may represent one or two selected from the group consisting of boron, silicon, scandium, yttrium, and cerium.

According to this, the cutting tool can have a longer tool lifetime.

DETAILED DESCRIPTION OF EMBODIMENTS

With reference to the drawings, specific examples of the cutting tool of the present disclosure will be described hereinafter. In the drawings of the present disclosure, a same reference sign represents same parts or corresponding parts. Dimensions such as length, width, thickness, and depth are appropriately modified to clarify and simplify the drawings, and do not always represent actual dimensions.

A description in the form of "A to B" herein means A or more and B or less. When A has no description of a unit and only B has a description of a unit, the unit of A and the unit of B are same.

When a compound and the like are represented by a chemical formula herein, any conventionally known atomic ratios are included unless the atomic ratio is particularly limited, and should not be necessarily limited to an atomic ratio within a stoichiometric range.

When one or more values are each described herein as lower limits of numerical ranges and upper limits of numerical ranges, combinations of any one value described as the lower limit and any one value described as the upper limit are also disclosed.

Embodiment 1: Cutting Tool (1)

The cutting tool according to an embodiment of the present disclosure will be described by using FIG. 1 to FIG. 5.

A cutting tool 1 according to an embodiment of the present disclosure (hereinafter, also referred to as "Embodiment 1") is cutting tool 1 comprising:
a base 2; and
a coating 3 disposed on base 2, wherein
coating 3 includes a first layer 13,
first layer 13 is composed of an alternate layer in which first unit layer 12 and
second unit layer 15 are alternately stacked,
first unit layer 12 is composed of $Ti_{1-a}Mo_aN$,
a represents 0.01 or more and 0.20 or less,
second unit layer 15 is composed of $Al_bCr_{1-b}N$, and
b represents 0.40 or more and 0.80 or less.

The cutting tool of Embodiment 1 can have a long tool lifetime even in cutting processing performed particularly under conditions of a high temperature on the cutting edge. The reason is presumed as follows.

The first unit layer is composed of $Ti_{1-a}Mo_aN$. Since containing Mo (molybdenum), the first unit layer is oxidized during cutting to generate $MoO_3$, which is an oxide of Mo. This $MoO_3$ has a melting point of 795° C., and thereby $MoO_3$ is softened at a temperature during cutting processing to have a function as a lubricant, and a frictional coefficient on a rake face of the tool can be attempted to be reduced. As a result, the first layer that includes the first unit layer can improve agglutination resistance, a sliding property, and wear resistance in process in which the cutting edge becomes hot, such as dry cutting processing.

The second unit layer is composed of $Al_bCr_{1-b}N$. The second unit layer contains Al. Since Al is easily oxidized, the coating that includes the second unit layer tends to easily form a dense oxide layer composed of $Al_2O_3$ on a surface side of the first layer. As a result, a heat shielding property and oxidation resistance of the first layer can be improved.

The second unit layer is oxidized during cutting to generate $Cr_2O_3$, which is an oxide of Cr. This $Cr_2O_3$ is extremely dense and stable, and thereby proceeding of oxidation of the first layer from a surface side can be inhibited during the cutting processing.

The first layer is composed of the alternate layer in which the first unit layer and the second unit layer are alternately stacked. On an interface between the first unit layer and the second unit layer, the compositions and the crystal lattices are discontinuous. Thus, when cracking occurs from a surface of the coating during cutting, the interface can inhibit development of the cracking. The coating that includes the first layer inhibits chipping and breakage.

From the above, the cutting tool that includes the first layer composed of the alternate layer in which the first unit layer and the second unit layer are alternately stacked has an improved tool lifetime.

<Cutting Tool>

Figure 2:
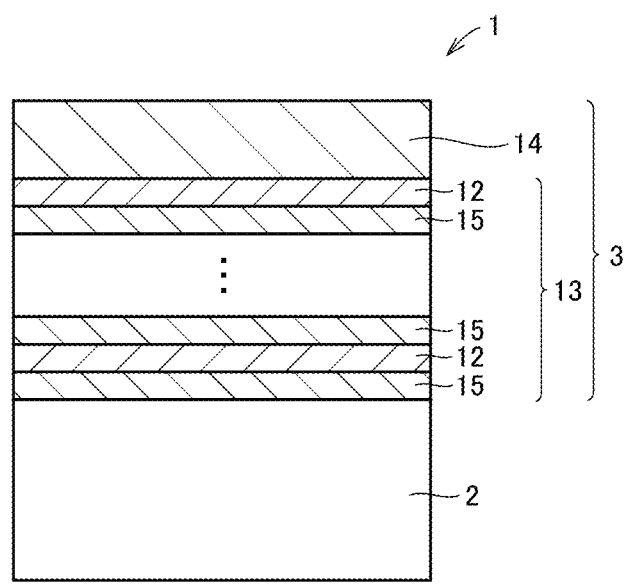
FIG. 2 is a schematic enlarged cross-sectional view of another example of a cutting tool according to Embodiment 1.

As illustrated in FIG. 1 and FIG. 2, cutting tool 1 according to an embodiment of the present invention comprises: base 2; and coating 3 disposed on coating 2. Coating 3 can cover at least a part involved in cutting in base 2. Coating 3 may cover an entire surface of base 2. The constitution of coating 3 that partially differs does not depart from the scope of the present embodiment. The part involved in cutting in base 2 herein means a region where a distance from a cutting edge ridgeline is at least within 50 μm, within 100 μm, or within 300 μm on a surface of base 2.

The cutting tool of Embodiment 1 can be suitably used as a cutting tool such as a drill, an endmill, an indexable cutting insert for a drill, an indexable cutting insert for an endmill, an indexable cutting insert for milling, an indexable cutting insert for turning, a metal saw, a gear-cutting tool, a reamer, and a tap.

<Base>

As the base, any conventionally known bases may be used. For example, the base may be composed of any of cemented carbide (such as WC-based cemented carbide, cemented carbide that contains WC and Co, cemented carbide in which a carbonitride of Ti, Ta, Nb, or the like is added into WC and Co), cermet (that contains TiC, TiN, TiCN, or the like as a main component), high-speed steel, ceramics (such as titanium carbide, silicon carbide, silicon nitride, aluminum nitride, and aluminum oxide), a cubic boron nitride sintered material, or a diamond sintered material.

The base may be particularly a WC-based cemented carbide or cermet (particularly, TiCN-based cermet). Since having particularly excellent balance between hardness and strength at high temperature, the WC-based cemented carbide or the cermet can contribute to lengthening of the lifetime of the cutting tool when used as the base of the cutting tool.

<Coating>

In the cutting tool of Embodiment 1, the coating includes the first layer. The coating has an effect of improving properties of the cutting tool such as wear resistance and chipping resistance to lengthen the lifetime of the cutting tool by covering the base.

Figure 3:
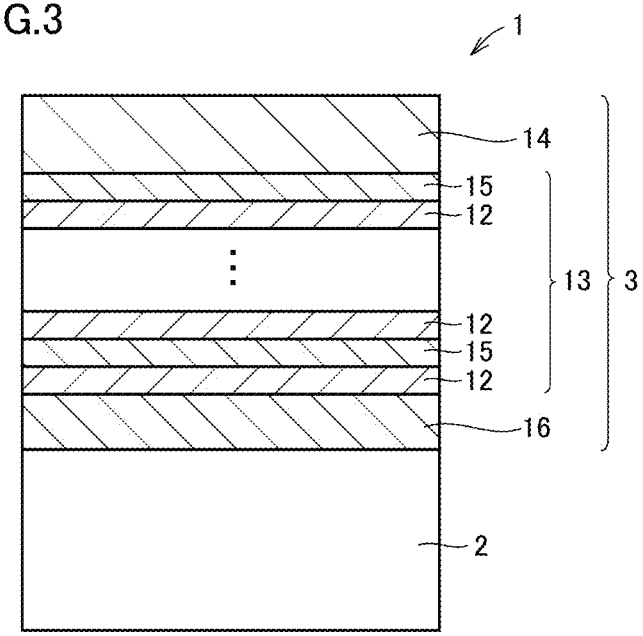
FIG. 3 is a schematic enlarged cross-sectional view of another example of a cutting tool according to Embodiment 1.
Figure 4:
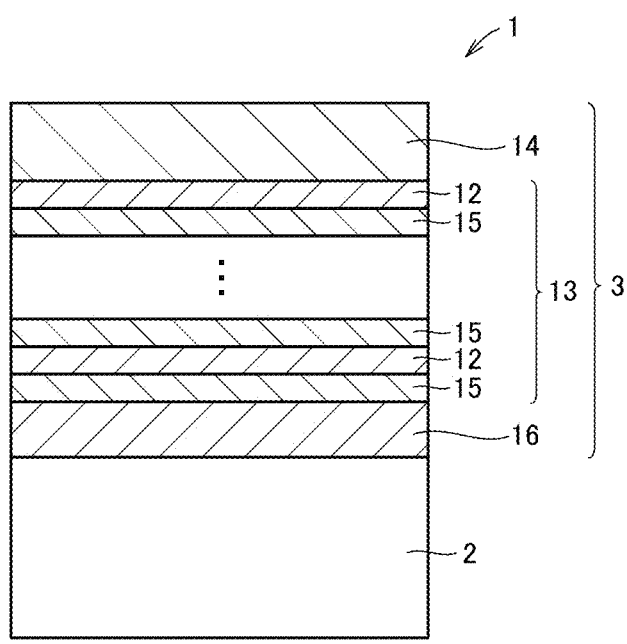
FIG. 4 is a schematic enlarged cross-sectional view of another example of a cutting tool according to Embodiment 1.

The coating may include another layer in addition to the first layer. As illustrated in FIG. 3 and FIG. 4, examples of the other layer include: underlayer 16 disposed between base 2 and first layer 13; and surface layer 14 provided on a side opposite to base 2 of first layer 13.

The coating may have an entire thickness of 0.4 μm or more and 15 μm or less. When the entire thickness of the coating is 0.4 μm or more, the effect of lengthening the lifetime of the cutting tool by providing the coating is easily obtained. Meanwhile, when the entire thickness of the coating is 15 μm or less, chipping on the coating in initial cutting hardly occurs, and the lifetime of the cutting tool can be lengthened.

The entire thickness of the coating can be measured by observing a cross section of the coating by using a scanning electron microscope (SEM). The cutting tool is cut in a direction along a normal line of the surface of the coating to prepare a cross-sectional sample. The cross-sectional sample is observed with an SEM. The observation magnification is 5,000 to 10,000, and the measurement field is 100 to 500 μm². Thickness widths of the coating are measured at three positions in one field, and an average value of the thickness widths at the three positions is calculated. The average value corresponds to the thickness of the entirety of the coating. A thickness of each layer described later is measured in the same manner unless otherwise specified.

A compressive residual stress of the coating may be 6 GPa or less in an absolute value. The compressive residual stress of the coating is a kind of internal stress (specific strain) present in an entirety of the coating, and refers to a stress represented by a "−" (negative) value (unit: "GPa" is used in the present embodiment). Thus, a concept of a large compressive residual stress represents a large absolute value of the value, and a concept of a small compressive residual stress represents a small absolute value of the value. That is, the absolute vale of the compressive residual stress of 6 GPa or less means that the compressive residual stress of coating 3 is −6 GPa or more and 0 GPa or less.

When the compressive residual stress of the coating is 0 GPa or less, development of cracking generated from the outermost surface of the coating is easily inhibited. Meanwhile, when the absolute value of the compressive residual stress is 6 GPa or less, a value of the stress is appropriate, and peeling of the coating from the edge part of the cutting tool before beginning of cutting is easily inhibited.

The compressive residual stress of the coating is measured by a $\sin^2 \psi$ method using an X-ray residual stress apparatus (see "X-Ray Stress Measurement" (The Society of Materials Science, Japan, published in 1981 by Yokendo Ltd. Publishers) pp. 54 to 66).

The hardness of the coating yields a large effect at 30 GPa or more and 55 GPa or less, and the hardness may be 35 GPa or more and 50 GPa or less. According to this, the coating has sufficient hardness. The hardness of an entirety of the coating is measured by a nano-indenter method (Nano Indenter XP, manufactured by MTS Systems Corporation). Specifically, the measurement is performed by a method in accordance with ISO14577, the measurement load is 10 mN (1 gf), hardness on the surface of coating 3 is measured at three positions, and an average value of the hardness at the three positions is calculated. The average value corresponds to the hardness of coating 3.

<First Layer>

In the cutting tool of Embodiment 1, the first layer is composed of an alternate layer in which a first unit layer and a second unit layer are alternately stacked. The first layer composed of the alternate layer in which the first unit layer and the second unit layer are alternately stacked can be confirmed by difference in contrast by observing a flake sample that contains a cross section of the coating with a transmission electron microscope (TEM).

Any of the first unit layer and the second unit layer may be disposed on a position closest to the base side. In FIG. 1, first unit layer 12 is disposed directly on base 2. In FIG. 2, second unit layer 15 is disposed directly on base 2. Any of first unit layer 12 and second unit layer 15 may be disposed on the surface side of coating 3. In FIG. 1, second unit layer 15 is disposed on the surface side of coating 3. In FIG. 2, first unit layer 12 is disposed on the surface side of coating 3.

A thickness of the first layer may be 0.5 µm or more and 15 µm or less, may be 2 µm or more and 15 µm or less, or may be 5 µm or more and 10 µm or less. When the thickness of the first layer is 0.5 µm or more, excellent wear resistance can be exhibited in continuous processing. When the thickness of first layer 13 is 15 µm or less, the cutting tool can have excellent chipping resistance in intermittent cutting.

The thickness of the first layer can be measured by observing a cross section of the coating by using a transmission electron microscope (TEM). The cutting tool is cut in a direction along a normal line of the surface of the coating to prepare a flake sample that contains the cross section. The flake sample is observed with a TEM. The observation magnification is 20,000 to 5,000,000, and the measurement field is 0.0016 to 80 µm². Thickness widths of the first layer are measured at three positions in one field, and an average value of the thickness widths at the three positions is calculated. The average value corresponds to the thickness of the first layer.

The first unit layer may have a cubic crystal structure. When the first unit layer has a cubic crystal structure, wear resistance of the coating is improved. The second unit layer may include a cubic crystal structure. When the second unit layer has a cubic crystal structure, hardness of the coating is improved. The crystal structure of each layer in the coating can be analyzed with an X-ray diffraction apparatus known in the field.

Examples of the apparatus used for the X-ray diffraction measurement include "SmartLab" (trade name), manufactured by Rigaku Corporation. The conditions of the X-ray diffraction measurement are as follows.

(XRD Measurement Conditions)
Scanning axis: 2θ-θ
X-ray source: Cu-Kα radiation (1.541862 Å)
Detector: 0-dimensional detector (scintillation counter)
Tube voltage: 45 kV
Tube current: 40 mA
Incident optics: utilizing mirror
Receiving light optics: utilizing analyzer crystal (PW3098/27)
Step 0.030
Scanning time: 2 seconds
Scanning range (2θ): 10° to 120°

<Composition of First Unit Layer and Composition of Second Unit Layer>

The first unit layer is composed of $Ti_{1-a}Mo_aN$, and "a" represents 0.01 or more and 0.20 or less. "a" may be 0.03 or more and 0.18 or less, may be 0.05 or more and 0.15 or less, or may be 0.08 or more and 0.14 or less.

The term "the first unit layer is composed of $Ti_{1-a}Mo_aN$" herein means that the first unit layer may contain an inevitable impurity in addition to $Ti_{1-a}Mo_aN$ as long as the effect of the present disclosure is not impaired. Examples of the inevitable impurity include oxygen and carbon. A content rate of an entirety of the inevitable impurity in the first unit layer may be larger than 0 atom % and less than 1 atom %.

The second unit layer is composed of $Al_bCr_{1-b}N$, and "b" represents 0.40 or more and 0.80 or less. "b" may be 0.45 or more and 0.75 or less, may be 0.50 or more and 0.70 or less, or may be 0.55 or more and 0.65 or less.

The term "the second unit layer is composed of $Al_bCr_{1-b}N$" herein means that second unit layer 15 may contain an inevitable impurity in addition to $Al_bCr_{1-b}N$ as long as the effect of the present disclosure is not impaired. Examples of the inevitable impurity include oxygen and carbon. A content rate of an entirety of the inevitable impurity in the second unit layer may be larger than 0 atom % and less than 1 atom %.

The "a", the "b", the content rate of the inevitable impurity in the first unit layer, and the content rate of the inevitable impurity in the second unit layer are measured by elemental analysis on the cross section of the coating using a transmission electron microscope (TEM). The cutting tool is cut in a direction along a normal line of the surface of the coating to prepare a flake sample that contains the cross section of the coating. The flake sample is irradiated with electron beam by using EDS (Energy Dispersive X-ray Spectroscopy) attached to the TEM, and energy and generation time of characteristic X-ray generated in this time are measured to perform elemental analysis on the first unit layer and the second unit layer. Five first unit layers and five second unit layers are randomly selected to perform the elemental analysis. An average composition of the five first unit layers is determined. This average composition corresponds to the composition of the first unit layer. An average composition of the five second unit layers is determined. This average composition corresponds to the composition of the second unit layer. When the numbers of layers of the first unit layers and the second unit layers are each four or less, the elemental analysis is performed on all the layers to determine average compositions of the first unit layers and the second unit layers. As long as an identical cutting tool is measured, it has been confirmed that the measurement results have no variation even by randomly selecting the measurement positions.

In the composition $Ti_{1-a}Mo_aN$ of the first unit layer in the present disclosure, a ratio $A_{N1}/A_{M1}$ of a number $A_{N1}$ of atoms of N relative to a total number $A_{M1}$ of atoms of Ti and Mo is 0.8 or more and 1.2 or less. In the composition $Al_bCr_{1-b}N$ of the second unit layer in the present disclosure, a ratio $A_{N2}/A_{M2}$ of a number $A_{N2}$ of atoms of N relative to a total number $A_{M2}$ of atoms of Al and Cr is 0.8 or more and 1.2 or less. The ratio $A_{N1}/A_{M1}$ and the ratio $A_{N2}/A_{M2}$ can be measured by a Rutherford backscattering (RBS) method. When the ratio $A_{N1}/A_{M1}$ and the ratio $A_{N2}/A_{M2}$ are within the above ranges, it has been confirmed that the effect of the present disclosure is not impaired.

<Average Thickness of First Unit Layers and Average Thickness of Second Unit Layers>

An average thickness of the first unit layers may be 0.002 µm or more and 0.2 µm or less, and an average thickness of the second unit layers may be 0.002 µm or more and 0.2 µm or less. According to this, development of cracking generated on the surface of the coating can be further inhibited. An average thickness of the first unit layers may be 0.005 µm or more and 0.15 µm or less, or may be 0.01 µm or more and 0.1 µm or less. The average thickness of the second unit layers may be 0.005 µm or more and 0.15 µm or less, or may be 0.01 µm or more and 0.10 µm or less.

The average thickness of the first unit layers and the average thickness of the second unit layers are measured by the same method as the method for measuring the thickness of the first layer.

Figure 5:
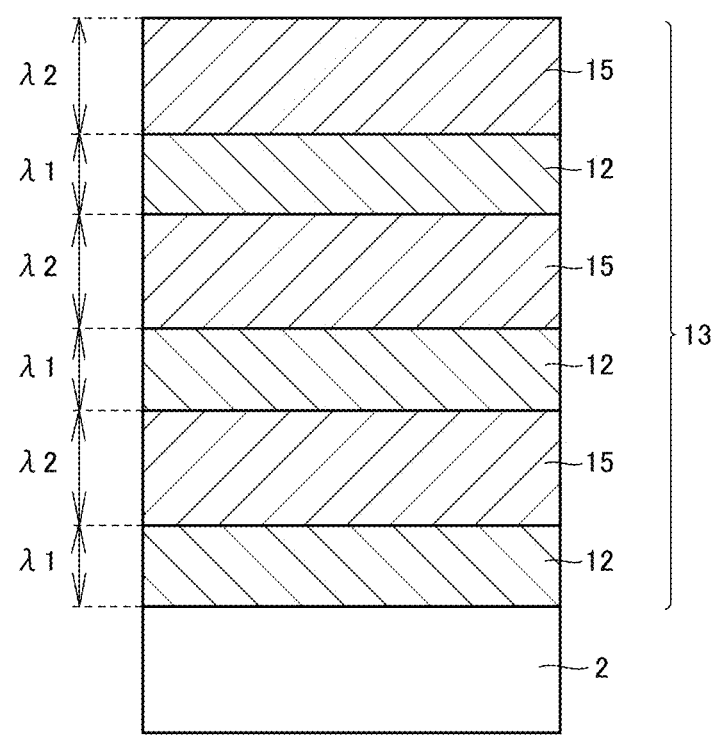
FIG. 5 is a view for describing an example of a ratio between thicknesses of a first unit layer and second unit layer.
Figure 6:
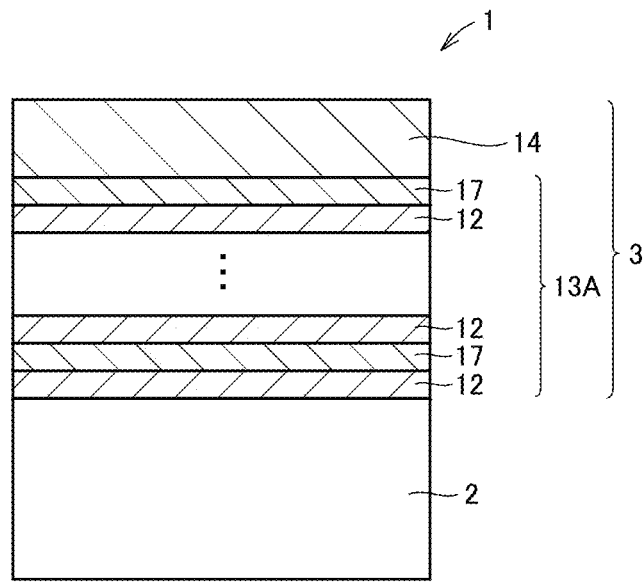
FIG. 6 is a schematic enlarged cross-sectional view of an example of a cutting tool according to Embodiment 2.
Figure 7:
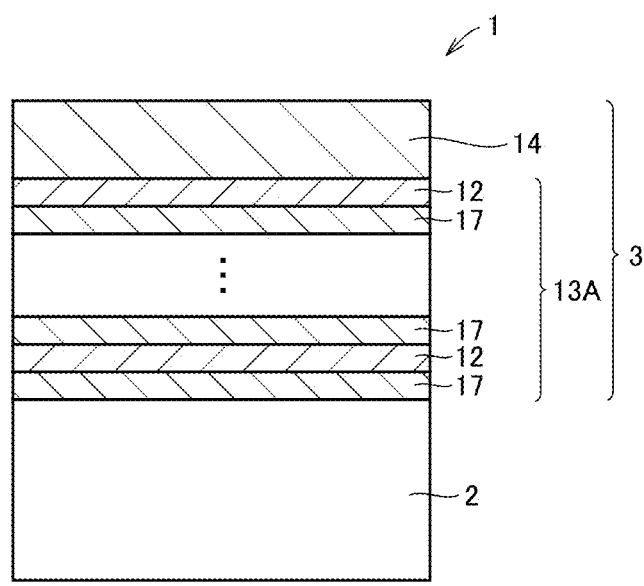
FIG. 7 is a schematic enlarged cross-sectional view of another example of a cutting tool according to Embodiment 2.

As illustrated in FIG. 5, in first unit layer 12 and second unit layer 15 adjacent to first unit layer 12, a ratio $\lambda 2/\lambda 1$ of a thickness $\lambda 2$ µm of second unit layer 15 to a thickness 2.1 µm of first unit layer 12 may be 1.0 or more and 5.0 or less. The second unit layer has high oxidation resistance, and in addition, low thermal conductivity and has a property of hardly conducting heat generated during cutting toward the base. When the ratio $\lambda 2/\lambda 1$ is 1.0 or more, a proportion of the second unit layer in the coating relatively increases to increase an Al amount in the coating, resulting in improvement of a heat shielding property as an entirety of the cutting tool, and wear resistance in continuous cutting is specifically improved. When $\lambda 2/\lambda 1$ is 1.0 or more, toughness of the coating tends to be improved. Meanwhile, when $\lambda 2/\lambda 1$ is 5.0 or less, the effect of inhibiting development of cracking by stacking first unit layer 12 and second unit layer 15 tends to be easily obtained.

$\lambda 2/\lambda 1$ may be 1.1 or more and 5.0 or less, may be 1.2 or more and 5.0 or less, may be 1.3 or more and 4.0 or less, may be 1.8 or more and 3.0 or less, or may be 2.0 or more and 2.5 or less.

Although all thicknesses of three first unit layers 12 are represented as $\lambda 1$ and all thicknesses of three second unit layers 15 are represented as 22 in FIG. 5 for description, the thicknesses $\lambda 1$ of three first unit layers 12 are not needed to be equal, and the thicknesses $\lambda 2$ of three second unit layers 15 are not needed to be equal as long as the above relationship of $\lambda 2/\lambda 1$ is satisfied between the first unit layer and the second unit layer adjacent to each other.

In the first layer, the number of stacking of each of the first unit layers and the second unit layers may be 5 or more and 500 or less, may be 10 or more and 500 or less, may be 100 or more and 400 or less, or may be 200 or more and 350 or less. According to this, stacking of the first unit layers and the second unit layers can sufficiently yield an effect of improving the hardness and the compressive residual stress with good balance.

In the first layer, the number of stacking of each of the first unit layers and the second unit layers can be determined by observing the flake sample of the cross section of the coating using a transmission electron microscope (TEM) with an observation magnification of 20,000 to 5,000,000.

<Underlayer>

As illustrated in FIG. 3 and FIG. 4, coating 3 may further include an underlayer 16 disposed between base 2 and first layer 13. A composition of underlayer 16 may be same as the composition of first unit layer 12 or the composition of second unit layer 15. According to this, adhesiveness between base 2 and coating 3 can be improved.

When the composition of the underlayer is same as the composition of the first unit layer, the underlayer has a good sliding property even when the underlayer is exposed in initial cutting, and thereby wear resistance can be improved.

When the composition of the underlayer is same as the composition of the first unit layer, a thickness of the underlayer may be larger than the thickness of the first unit layer. According to this, adhesiveness between the base and the coating can be further increased. The thickness of the underlayer may be more than 1.0 time and 500 times or less, may be 2.0 times or more and 500 times or less, may be 4.0 times or more and 120 times or less, or may be 10.0 times or more and 50 times or less larger than the thickness of the first unit layer.

When the composition of the underlayer is same as the composition of the first unit layer, the thickness of the underlayer may be 0.1 µm or more and 2 µm or less, may be 0.3 µm or more and 2 µm or less, or may be 0.4 µm or more and 2 µm or less. If the thickness of the underlayer is less than 0.1 µm, the effect of improving wear resistance by setting the underlayer to have the same composition as the first unit layer tends to be difficult to obtain. If the thickness of the underlayer is more than 2 µm, the crystal grains are enlarged to generate a grain boundary, which tends to be difficult to obtain the effect of improving wear resistance.

When the composition of the underlayer is same as the composition of the first unit layer, first unit layer 12 may be stacked directly on underlayer 16, as illustrated in FIG. 3. As illustrated in FIG. 4, second unit layer 15 may also be stacked directly on underlayer 16. When the composition of underlayer 16 is same as the composition of first unit layer 12 and first unit layer 12 is stacked directly on underlayer 16, underlayer 16 and first unit layer 12 have a continuous crystal structure.

When the composition of the underlayer is same as the composition of the second unit layer, oxidation from the interface between the base and the coating can be inhibited and the cutting heat can be shielded even when the underlayer is exposed in initial cutting.

When the composition of the underlayer is same as the composition of the second unit layer, the thickness of the underlayer may be larger than the thickness of the second unit layer. According to this, adhesiveness between the base and the coating can be further increased. The thickness of the underlayer may be more than 1.0 time and 500 times or less, may be 2.0 times or more and 500 times or less, may be 4.0 times or more and 120 times or less, or may be 10.0 times or more and 50 times or less larger than the thickness of the second unit layer.

When the composition of the underlayer is same as the composition of the second unit layer, the thickness of the underlayer may be 0.1 µm or more and 2 µm or less, may be 0.3 µm or more and 2 µm or less, or may be 0.4 µm or more and 2 µm or less.

When the composition of the underlayer is same as the composition of the second unit layer, first unit layer 12 may be stacked directly on underlayer 16, as illustrated in FIG. 3. As illustrated in FIG. 4, second unit layer 15 may also be stacked directly on underlayer 16. When the composition of underlayer 16 is same as the composition of second unit layer 15 and second unit layer 15 is stacked directly on underlayer 16, underlayer 16 and second unit layer 15 have a continuous crystal structure.

<Surface Layer>

As illustrated in FIG. 1 to FIG. 4, coating 3 may further include a surface layer 14 provided on a side opposite to base 2 of first layer 13. Surface layer 14 may be composed of TiMoON or AlCrON. According to this, a frictional coefficient on the coating can be reduced to attempt to lengthen the lifetime of the cutting tool.

An oxynitride typically tends to have higher agglutination resistance against workpiece than a nitride. The improvement of the agglutination resistance is presumably due to contribution of the oxygen atom. When the coating includes the surface layer composed of an oxynitride, agglutination resistance of the coating against the workpiece is improved to lengthen the lifetime of the cutting tool.

In the surface layer, regulating a composition ratio between O and N enables imparting a predetermined color. According to this, design properties and distinctive properties can be imparted to appearance of the cutting tool, which yields commercial usefulness.

A thickness of surface layer 14 may be 0.1 µm or more and 2 µm or less. When the thickness of surface layer 14 is 0.1 µm or more, an effect of imparting lubricity by surface layer 14 is easily obtained. The thickness of the surface layer of more than 2 µm tends to fail to further improve the aforementioned effect of imparting lubricity. Thus, the thickness of the surface layer may be 2 µm or less with considering a cost aspect.

<Intermediate Layer>

In the cutting tool of Embodiment 1, the coating may include an intermediate layer disposed between the underlayer and the first layer. Examples of the intermediate layer include TiMoN, AlCrCeN, AlCrN, AlCrBN, AlCrSiN, AlCrYN, AlCrScN. A thickness of the intermediate layer may be 0.1 µm or more and 2 µm or less, may be 0.3 µm or more and 1.5 µm or less, or may be 0.4 µm or more and 1.0 µm or less.

Embodiment 2: Cutting Tool (2)

A cutting tool according to another embodiment of the present disclosure will be described by using FIG. 6 to FIG. 10.

A cutting tool 1 according to another embodiment (hereinafter, also referred to as "Embodiment 2") of the present disclosure is cutting tool 1 comprising:

a base 2; and a coating 3 disposed on base 2, wherein coating 3 includes a second layer 13A, second layer 13A is composed of an alternate layer in which a first unit layer 12 and a third unit layer 17 are alternately stacked, first unit layer 12 is composed of $Ti_{1-a}Mo_aN$, a represents 0.01 or more and 0.20 or less, third unit layer 17 is composed of $Al_cCr_{1-c-d}X_dN$, X represents one or two selected from the group consisting of boron, silicon, scandium, yttrium, and cerium, c represents 0.40 or more and 0.80 or less, and d represents 0.001 or more and 0.05 or less.

The cutting tool of Embodiment 2 can have a long tool lifetime even in cutting processing performed particularly under conditions of a high temperature on the cutting edge. The reason is presumed as follows.

The first unit layer is composed of $Ti_{1-a}Mo_aN$. Therefore, for the reason same as the reason described in Embodiment 1, the first layer that includes the first unit layer can improve agglutination resistance, a sliding property, and wear resistance in process in which the cutting edge becomes hot, such as dry cutting processing.

The third unit layer is composed of $Al_cCr_{1-c-d}X_dN$. The third unit layer includes Al. Since Al is easily oxidized, the coating that includes the third unit layer tends to easily form a dense oxide layer composed of $Al_2O_3$ on a surface side of the second layer. As a result, a heat shielding property and oxidation resistance of the second layer can be improved.

The third unit layer is oxidized during cutting to generate $Cr_2O_3$, which is an oxide of Cr. This $Cr_2O_3$ is extremely dense and stable, and thereby proceeding of oxidation of the second layer from the surface side can be inhibited during the cutting processing.

The second layer is composed of an alternate layer in which the first unit layer and the third unit layer are alternately stacked. On an interface between the first unit layer and the third unit layer, the compositions and the crystal lattices are discontinuous. Thus, when cracking occurs from a surface of the coating during cutting, the interface can inhibit development of the cracking. The coating that includes the second layer inhibits chipping and breakage.

The cutting tool of Embodiment 2 may have basically same constitution as the cutting tool of Embodiment 1 except for constitution of the second layer, the underlayer, and the surface layer. Hereinafter, "second layer", "underlayer", and "surface layer" will be described.

<Second Layer>

In the cutting tool of Embodiment 2, the second layer is composed of an alternate layer in which the first unit layer and the third unit layer are alternately stacked. The second layer composed of the alternate layer in which the first unit layer and the third unit layer are alternately stacked can be confirmed by difference in contrast by observing a cross section of the coating with a TEM. A thickness of the second layer may be same as the thickness of the first layer described in Embodiment 1. Any of the first unit layer and the third unit layer may be disposed at a position closest to the side of the base. The first unit layer may have a cubic crystal structure. The third unit layer may include a cubic crystal structure.

<Composition of First Unit Layer and Composition of Third Unit Layer>

The composition $Ti_{1-a}Mo_aN$ of the first unit layer of Embodiment 2 may be same as the composition $Ti_{1-a}Mo_aN$ of the first unit layer of Embodiment 1.

The third unit layer is composed of $Al_cCr_{1-c-d}X_dN$, X represents one or two selected from the group consisting of boron, silicon, scandium, yttrium, and cerium, "c" represents 0.40 or more and 0.80 or less, and "d" represents 0.001 or more and 0.05 or less. Third unit layer 17 can have both of excellent hardness and excellent oxidation resistance. The reason is presumed as follows.

When X represents boron in the third unit layer $Al_cCr_{1-c-d}X_dN$, boron increases hardness of the third unit layer to increase hardness of an entirety of the coating. An oxide of boron formed by oxidation on the surface of the cutting tool in cutting densifies an oxide of Al in the third unit layer to improve oxidation resistance of the third unit layer. Furthermore, since having a low melting point, the oxide of boron serves as a lubricant during cutting, and can inhibit agglutination of workpiece.

When X represents silicon in the third unit layer $Al_cCr_{1-c-d}X_dN$, structure of the third unit layer becomes fine to improve hardness and oxidation resistance of the third unit layer, resulting in improvement of the hardness and the oxidation resistance of an entirety of the coating.

When X represents one or two selected from the group consisting of scandium (Sc), yttrium (Y), and cerium (Ce) in the third unit layer $Al_cCr_{1-c-d}X_dN$, the above element precipitates on a grain boundary of the third unit layer to allow an oxide thereof to inhibit inward diffusion of oxygen from the coating surface through the grain boundary, resulting in improvement of oxidation resistance of the third unit layer and a further longer lifetime of the cutting tool that includes the third unit layer.

The "c" is 0.40 or more and 0.80 or less. According to this, the crystal structure of the third unit layer becomes cubic to increase hardness of the third unit layer and improve wear resistance. "c" may be 0.45 or more and 0.75 or less, may be 0.50 or more and 0.70 or less, or may be 0.55 or more and 0.65 or less.

The "d" is 0.001 or more and 0.05 or less. According to this, hardness and oxidation resistance of the second layer can be improved. "d" may be 0.01 or more and 0.05 or less, may be 0.02 or more and 0.05 or less, may be 0.02 or more and 0.04 or less, or may be 0.02 or more and 0.03 or less.

The term "the third unit layer is composed of $Al_cCr_{1-c-d}X_dN$" herein means that the third unit layer may contain an inevitable impurity in addition to $Al_cCr_{1-c-d}X_dN$ as long as the effect of the present disclosure is not impaired. Examples of the inevitable impurity include oxygen and carbon. A content rate of an entirety of the inevitable impurity in the third unit layer may be larger than 0 atom % and less than 1 atom %.

The "c", the "d", and the content rate of the inevitable impurity in the third unit layer are measured by using a transmission electron microscope (TEM). A specific measurement method is same as the method for measuring the "a" described in Embodiment 1. As long as an identical cutting tool is measured, it has been confirmed that the measurement results have no variation even by randomly selecting the measurement positions.

In the composition $Ti_{1-a}Mo_aN$ of the first unit layer in the present disclosure, a ratio $A_{N1}/A_{M1}$ of a number $A_{N1}$ of atoms of N relative to a total number $A_{M1}$ of atoms of Ti and Mo is 0.8 or more and 1.2 or less. In the composition $Al_cCr_{1-c-d}X_dN$ of the third unit layer in the present disclosure, a ratio $A_{N3}/A_{M3}$ of a number $A_{N3}$ of atoms of N relative to a total number $A_{M3}$ of atoms of Al, Cr, and X is 0.8 or more and 1.2 or less. The ratio $A_{N3}/A_{M3}$ can be measured by a Rutherford backscattering (RBS) method. When the ratio $A_{N1}/A_{M1}$ and the ratio $A_{N3}/A_{M3}$ are within the above ranges, it has been confirmed that the effect of the present disclosure is not impaired.

<Average Thickness of First Unit Layers and Average Thickness of Third Unit Layers>

An average thickness of the first unit layers may be 0.002 µm or more and 0.2 µm or less, and an average thickness of the third unit layers may be 0.002 µm or more and 0.2 µm or less. According to this, development of cracking generated on the surface of the coating can be further inhibited. The average thickness of the first unit layers may be 0.005 µm or more and 0.15 µm or less, or may be 0.01 µm or more and 0.1 µm or less. The average thickness of the third unit layers may be 0.005 µm or more and 0.15 µm or less, or may be 0.01 µm or more and 0.10 µm or less.

The average thickness of the first unit layers and the average thickness of the third unit layers can be measured by a method same as the method for measuring the thickness of the first layer described in Embodiment 1.

Figure 10:
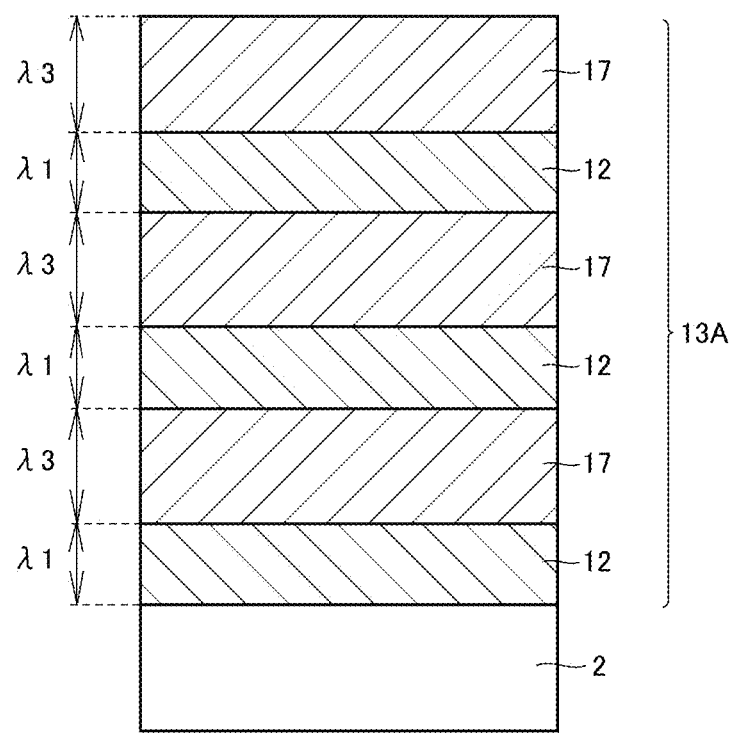
FIG. 10 is a view for describing an example of a ratio between thicknesses of a first unit layer and third unit layer.

As illustrated in FIG. 10, in first unit layer 12 and third unit layer 17 adjacent to first unit layer 12, a ratio λ3/λ1 of a thickness λ3 µm of third unit layer 17 to a thickness λ1 µm of first unit layer 12 may be 1.0 or more and 5.0 or less. The third unit layer has high oxidation resistance, and in addition, low thermal conductivity and has a property of hardly conducting heat generated during cutting toward the base. When the ratio λ3/λ1 is 1.0 or more, a proportion of the third unit layer in the coating relatively increases to increase an Al amount in the coating, resulting in improvement of a heat shielding property as an entirety of the cutting tool, and wear resistance in continuous cutting is specifically improved. When λ3/λ1 is 1.0 or more, toughness of the coating tends to be improved. Meanwhile, when λ3/λ1 is 5.0 or less, the effect of inhibiting development of cracking by stacking the first unit layer and the third unit layer tends to be easily obtained.

λ3/λ1 may be 1.1 or more and 5.0 or less, may be 1.2 or more and 5.0 or less, may be 1.3 or more and 4.0 or less, may be 1.8 or more and 3.0 or less, or may be 2.0 or more and 2.5 or less.

Although all thicknesses of three first unit layers 12 are represented as λ1 and all thicknesses of three third unit layers 17 are represented as λ3 in FIG. 10 for description, the thicknesses λ1 of three first unit layers 12 are not needed to be equal, and the thicknesses λ3 of three third unit layers 17 are not needed to be equal as long as the above relationship of λ3/λ1 is satisfied between the first unit layer and the third unit layer adjacent to each other.

In the second layer, the number of stacking of each of the first unit layers and the third unit layers may be 4 or more and 800 or less, may be 10 or more and 500 or less, may be 100 or more and 400 or less, or may be 200 or more and 350 or less.

According to this, stacking of the first unit layers and the third unit layers can sufficiently yield an effect of improving the hardness and the compressive residual stress with good balance.

In the second layer, the number of stacking of each of the first unit layers and the third unit layers can be determined in the same method as the method of measuring the number of stacking of each of the first unit layers and the second unit layers described in Embodiment 1.

<Underlayer>

Figure 8:
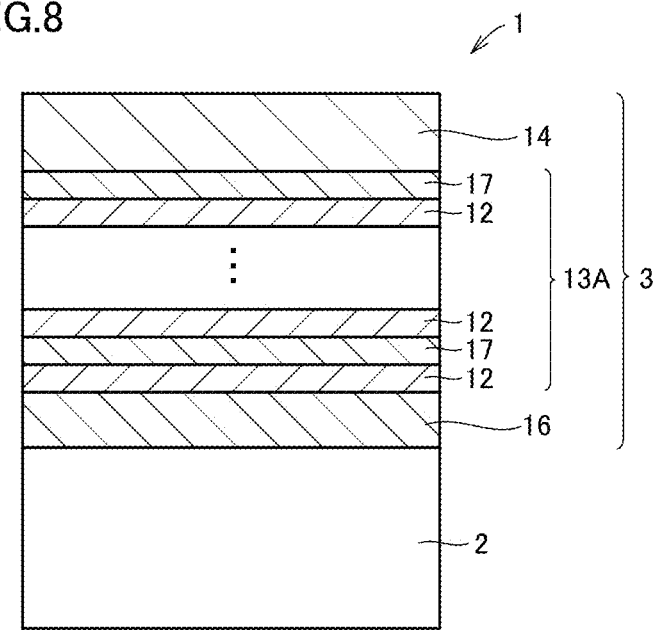
FIG. 8 is a schematic enlarged cross-sectional view of another example of a cutting tool according to Embodiment 2.
Figure 9:
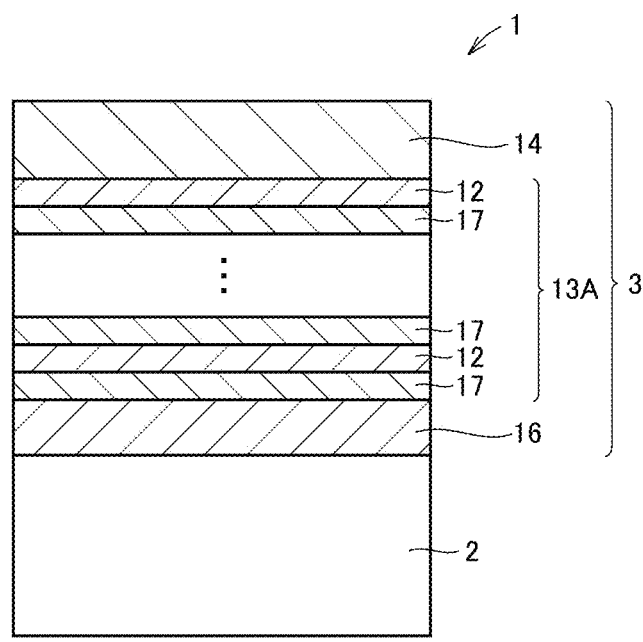
FIG. 9 is a schematic enlarged cross-sectional view of another example of a cutting tool according to Embodiment 2.

As illustrated in FIG. 8 and FIG. 9, coating 3 may further include an underlayer 16 disposed between base 2 and second layer 13A, and a composition of underlayer 16 may be same as the composition of first unit layer 12 or the composition of third unit layer 17. According to this, adhesiveness between base 2 and coating 3 can be improved.

The effect in a case where the composition of the underlayer is same as the composition of the first unit layer, and a thickness of the underlayer are as described in Embodiment 1.

When the composition of underlayer 16 is same as the composition of third unit layer 17, peeling resistance of the coating can be improved particularly in intermittent processing such as milling and endmill processing, which repeatedly applies a load to the cutting edge, because the third unit layer tends to have small stress.

When the composition of the underlayer is same as the composition of the third unit layer, the thickness of the underlayer may be larger than the thickness of the third unit layer. According to this, adhesiveness between the base and the coating can be further improved. The thickness of the underlayer may be more than 1.0 time and 500 times or less, may be 2.0 times or more and 500 times or less, may be 4.0 times or more and 120 times or less, or may be 10.0 times or more and 50 times or less larger than the thickness of the third unit layer.

When the composition of the underlayer is same as the composition of the third unit layer, the thickness of the underlayer may be 0.1 µm or more and 2 µm or less, may be 0.3 µm or more and 2 µm or less, or may be 0.4 µm or more and 2 µm or less.

When the composition of the underlayer is same as the composition of the third unit layer, the first unit layer may be stacked directly on the underlayer, as illustrated in FIG. 8. As illustrated in FIG. 9, the third unit layer may also be stacked directly on the underlayer. When the composition of the underlayer is same as the composition of the third unit layer and the third unit layer is stacked directly on the underlayer, the underlayer and the third unit layer have a continuous crystal structure.

<Surface Layer>

As illustrated in FIG. 6 to FIG. 9, coating 3 may further include a surface layer 14 disposed on a side opposite to base 2 of second layer 13A. Surface layer 14 may be composed of TiMoON or AlCrXON. Here, X may represent one or two selected from the group consisting of boron, silicon, scandium, yttrium, and cerium. X may represent an element same as X used in the third unit layer. According to this, a frictional coefficient on the coating can be reduced to attempt to lengthen the lifetime of the cutting tool.

In the surface layer, regulating a composition ratio between O and N enables imparting a predetermined color. According to this, design properties and distinctive properties can be imparted to appearance of the cutting tool, which yields commercial usefulness.

A thickness of surface layer 14 may be as described in Embodiment 1.

Embodiment 3: Method for Manufacturing Cutting Tool

In Embodiment 3, a method for manufacturing a cutting tool of Embodiment 1 or Embodiment 2 will be described. A method for manufacturing a cutting tool of Embodiment 3 comprises: a first step of preparing a base; and a second step of forming a coating on the base. The second step comprises a step of forming a first layer or a second layer. Each step will be described in detail hereinafter.

<First Step>

In the first step, a base is prepared. As the base, the base described in Embodiment 1 may be used. Any bases conventionally known may be prepared.

<Second Step>

In the second step, the coating is formed on the base. The second step includes forming a first layer or a second layer.

In the step of forming the first layer, the first unit layer and the second unit layer are alternately stacked by using a physical vapor deposition (PVD) method to form the first layer. In the step of forming the second layer, the first unit layer and the third unit layer are alternately stacked by using a PVD method to form the second layer. To improve wear resistance of the coating that includes the first layer or the second layer, it is effective to form a layer composed of a compound that has high crystallinity. The present inventors have found that the layer composed of a compound that has high crystallinity can be formed and the coating has excellent wear resistance by using the physical vapor deposition method as a method for forming the first layer and the second layer.

As the PVD method, at least one selected from the group consisting of a cathode arc-ion plating method, a balanced magnetron sputtering method, an unbalanced magnetron sputtering method, and a high power impulse magnetron sputtering (HiPIMS) method may be used. A cathode arc-ion plating method that has a high ionization rate of raw material elements may be used. When the cathode arc-ion plating method is used, an ion bombardment treatment with metal for a surface of the base can be performed before the first layer or the second layer is formed. Thus, adhesiveness between the base and the coating that includes the first layer or the second layer is remarkably improved.

The cathode arc-ion plating method can be performed by: placing the base in an apparatus and placing a target as a cathode; and then applying high voltage to the target for generating arc discharge to ionize and evaporate atoms that constitute the target; and depositing a substance on the base, for example.

The balanced magnetron sputtering method can be performed by: placing the base in an apparatus and placing a target on a magnetron electrode that has a magnet to form a balanced magnetic field; applying high-frequency electric power between the magnetron electrode and the base to generate gas plasma; and allowing gas ions generated by generation of this gas plasma to collide with the target; and depositing atoms released from the target on the base, for example.

The unbalanced magnetron sputtering method can be performed by setting the magnetic field to be generated by the magnetron electrode to be unbalanced in the aforementioned balanced magnetron spattering method, for example. The HiPIMS method, which can apply further higher voltage to obtain a dense film, may also be used.

<Other Steps>

The second step may comprise, in addition to the step of forming the first layer or the second layer, a step of treating a surface of the coating, such as polishing using a brush and a dry or wet shot blasting. The second step may also comprise a step of forming other layers such as an underlayer, a surface layer, and an intermediate layer. The other layers can be formed by conventionally known chemical vapor deposition method or physical vapor deposition method. From the viewpoint of ability of forming the other layer continuously to the first unit layer, the second unit layer, or the third unit layer in one physical vapor deposition apparatus, the other layer is preferably formed by a physical vapor deposition method.

EXAMPLES

The present embodiments will be further specifically described with Examples. However, the present embodiments are not limited by these Examples.

Example 1

<Sample 1 to Sample 19 and Sample 101 to Sample 105>
<<Production of Cutting Tool>>

Figure 11:
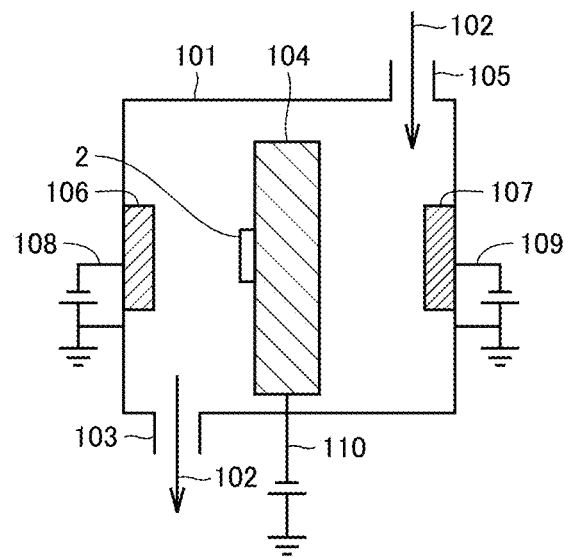
FIG. 11 is a schematic cross-sectional view of a cathode arc-ion plating apparatus used in Example.
Figure 12:
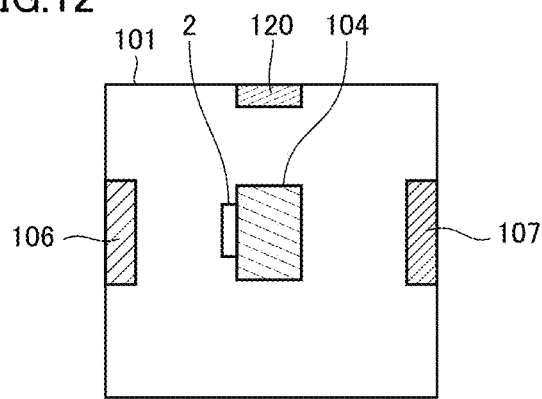
FIG. 12 is a schematic top view of the cathode arc-ion plating apparatus illustrated in FIG. 11.

FIG. 11 is a schematic cross-sectional view of a cathode arc-ion plating apparatus used in Example 1. FIG. 12 is an outline top view of the apparatus in FIG. 11.

In the apparatus in FIG. 11 and FIG. 12, a cathode 106 for a first unit layer, a cathode 107 for a second unit layer, and a cathode 120 for a surface layer, which are alloy targets to be metal raw materials of a coating, and a rotary base holder 104 for placing the base are attached in a chamber 101. A composition of cathode 106 is adjusted to obtain a composition of the first unit layer in Table 1. A composition of cathode 107 is adjusted to obtain a composition of the second unit layer in Table 1. A composition of cathode 120 is adjusted to obtain a composition of the surface layer in Table 2.

An arc power source 108 is attached to cathode 106, an arc power source 109 is attached to cathode 107, and an arc power source (not illustrated) is attached to cathode 120. A bias power source 110 is attached to base holder 104. In chamber 101, a gas introducing port 105 to introduce gas 102 is provided and a gas discharging port 103 is provided for regulating a pressure in chamber 101, and chamber 101 has structure in which gas 102 in chamber 101 can be sucked by a vacuum pump through gas discharging port 103.

On base holder 104, a chip of CNMG120408 that was a cemented carbide of JIS Standard K20 grade and that had JIS Standard shape, and a chip of SEMT13T3AGSN manufactured by Sumitomo Electric Hardmetal Corp. were attached as the base.

Then, a pressure in chamber 101 was reduced by the vacuum pump, and a temperature was raised to 600° C. by a heater placed in the apparatus while rotating the base, and evacuation was performed until the pressure in chamber 101 reached $1.0 \times 10^{-4}$ Pa. Then, argon gas was introduced through the gas introducing port to hold the pressure in chamber 101 to be 2.0 Pa, a voltage of bias power source 110 was gradually raised to −1000 V, and cleaning of a surface of the base was performed for 15 minutes. Thereafter, the argon gas was discharged from chamber 101 to clean the base (argon bombard treatment). As above, the base of a cutting tool of each sample was prepared.

Then, in a state where the base was rotated at a center, are current was supplied to cathodes 106 and 107 at each 150 A while introducing nitrogen as a reaction gas and holding a base temperature at 600° C., a reaction gas pressure at 3.3 Pa, and a voltage of bias power source 110 at a predetermined constant value within a range of −50 V to −200 V to generate metal ions from cathodes 106 and 107, and the underlayer that had a composition shown in Table 2 and the first layer that had a composition shown in Table 1 were formed on the base.

When the underlayer was formed, the first layer was formed by alternately stacking each of the first unit layers and the second unit layers one by one on the underlayer with the number of stacking shown in Table 1. When the underlayer was not formed, the first layer was formed by alternately stacking each of the first unit layers and the second unit layers one by one on the base with the number of stacking shown in Table 1. The thickness of the underlayer, thickness and the number of stacking of each of the first unit layers and the second unit layers in the first layer were regulated by a rotation speed of the base. At a time when the thicknesses of the underlayer and the first layer reached the thicknesses respectively shown in Table 1 and Table 2, current supplied to the evaporation source was stopped. The description "-" in the column "Underlayer" in Table 2 represents that the underlayer is absent.

Then, while introducing nitrogen gas and oxygen gas as reaction gasses into chamber 101 and holding a base temperature at 500° C., a reaction gas pressure at 2.0 Pa, and the voltage of bias power source 110 at −350 V, arc current at 120 A was supplied to cathode 120 to generate metal ions from cathode 120, and a surface layer was formed on the first layer. At a time when the thickness of the surface layer reached a thickness shown in Table 2, current supplied to the evaporation source was stopped. Amounts of introduced nitrogen gas and oxygen gas were regulated so as to obtain a composition of the surface layer in Table 2. As above, the cutting tool of each sample was produced. The description "-" in the column "Surface layer" in Table 2 represents that the surface layer is absent.

TABLE 1

| | First layer | | | | | |
|---|---|---|---|---|---|---|
| | First unit layer ($Ti_{1-a}Mo_aN$) | | Second unit layer ($Al_bCr_{1-b}N$) | | | |
| Sample No. | a | Average thickness [μm] | b | Average thickness [μm] | λ2/λ1 | Number of stacking | Thickness [μm] |
| 1 | 0.01 | 0.002 | 0.40 | 0.006 | 3.0 | 300 | 2.4 |
| 2 | 0.01 | 0.050 | 0.60 | 0.15 | 3.0 | 80 | 16.0 |
| 3 | 0.01 | 0.200 | 0.80 | 0.100 | 0.5 | 50 | 15.0 |
| 4 | 0.20 | 0.002 | 0.40 | 0.006 | 3.0 | 300 | 2.4 |
| 5 | 0.20 | 0.100 | 0.60 | 0.180 | 1.8 | 40 | 11.2 |
| 6 | 0.20 | 0.200 | 0.80 | 0.200 | 1.0 | 30 | 12.0 |
| 7 | 0.01 | 0.003 | 0.40 | 0.002 | 0.7 | 300 | 1.5 |
| 8 | 0.10 | 0.015 | 0.40 | 0.100 | 6.7 | 100 | 11.5 |
| 9 | 0.20 | 0.100 | 0.40 | 0.200 | 2.0 | 50 | 15.0 |
| 10 | 0.01 | 0.003 | 0.80 | 0.002 | 0.7 | 90 | 0.5 |
| 11 | 0.10 | 0.030 | 0.80 | 0.100 | 3.3 | 18 | 2.3 |
| 12 | 0.20 | 0.150 | 0.80 | 0.200 | 1.3 | 60 | 21.0 |
| 13 | 0.03 | 0.007 | 0.40 | 0.009 | 1.3 | 210 | 3.4 |
| 14 | 0.05 | 0.002 | 0.50 | 0.002 | 1.0 | 500 | 2.0 |
| 15 | 0.08 | 0.200 | 0.55 | 0.200 | 1.0 | 8 | 3.2 |
| 16 | 0.12 | 0.200 | 0.65 | 0.400 | 2.0 | 4 | 2.4 |
| 17 | 0.14 | 0.020 | 0.70 | 0.100 | 5.0 | 50 | 6.0 |
| 18 | 0.15 | 0.020 | 0.75 | 0.100 | 5.0 | 100 | 12.0 |
| 19 | 0.18 | 0.020 | 0.40 | 0.100 | 5.0 | 120 | 14.4 |
| 101 | 0.005 | 0.002 | 0.40 | 0.006 | 3.0 | 300 | 2.4 |
| 102 | 0.25 | 0.002 | 0.40 | 0.006 | 3.0 | 300 | 2.4 |
| 103 | 0.03 | 0.007 | 0.30 | 0.009 | 1.3 | 210 | 3.4 |
| 104 | 0.10 | 0.030 | 0.90 | 0.100 | 3.3 | 18 | 2.3 |
| 105 | — | — | 0.65 | 2.400 | — | 1 | 2.4 |

TABLE 2

| | Underlayer | | Surface layer | | Thickness of coating [μm] | Cutting test 1 Cutting time [min] | Cutting test 2 Cutting length [km] |
|---|---|---|---|---|---|---|---|
| Sample No. | Composition | Thickness [μm] | Composition | Thickness [μm] | | | |
| 1 | — | — | — | — | 2.4 | 70 | 5.2 |
| 2 | — | — | — | — | 16.0 | 100 | 7.1 |
| 3 | — | — | — | — | 15.0 | 95 | 6.6 |
| 4 | — | — | — | — | 2.4 | 69 | 5.1 |
| 5 | — | — | — | — | 11.2 | 90 | 6.1 |
| 6 | — | — | — | — | 12.0 | 92 | 6.5 |
| 7 | — | — | — | — | 1.5 | 65 | 4.6 |
| 8 | — | — | — | — | 11.5 | 91 | 6.3 |
| 9 | — | — | — | — | 15.0 | 98 | 6.9 |
| 10 | — | — | — | — | 0.5 | 50 | 4.0 |

TABLE 2-continued

| | Underlayer | | Surface layer | | Thickness of coating [μm] | Cutting test 1 Cutting time [min] | Cutting test 2 Cutting length [km] |
|---|---|---|---|---|---|---|---|
| Sample No. | Composition | Thickness [μm] | Composition | Thickness [μm] | | | |
| 11 | — | — | — | — | 2.3 | 68 | 5.0 |
| 12 | — | — | — | — | 21.0 | 110 | 7.5 |
| 13 | — | — | — | — | 3.4 | 75 | 5.8 |
| 14 | — | — | — | — | 2.0 | 67 | 4.8 |
| 15 | — | — | — | — | 3.2 | 73 | 5.7 |
| 16 | — | — | — | — | 2.4 | 71 | 5.5 |
| 17 | TiMoN | 0.5 | — | — | 6.5 | 86 | 6.0 |
| 18 | AlCrN | 0.5 | TiMoON | 0.6 | 13.1 | 96 | 6.7 |
| 19 | — | — | AlCrON | 0.8 | 15.2 | 102 | 7.2 |
| 101 | — | — | — | — | 2.4 | 25 | 2.1 |
| 102 | — | — | — | — | 2.4 | 24 | 1.9 |
| 103 | — | — | — | — | 3.4 | 28 | 2.3 |
| 104 | — | — | — | — | 2.3 | 22 | 1.8 |
| 105 | — | — | — | — | 2.4 | 20 | 1.5 |

<Evaluation>
<Measurement of Composition of First Unit Layer>

The composition of the first unit layer in the cutting tool of each sample was measured by the method described in Embodiment 1 to obtain a value of "a" in $Ti_{1-a}Mo_aN$. The results are shown in the column "a" in Table 1. In Table 1, a case where "-" is described in the column "a" means that the first unit layer is absent.

<Measurement of Composition of Second Unit Layer>

The composition of the second unit layer in the cutting tool of each sample was measured by the method described in Embodiment 1 to obtain a value of "b" in $Al_bCr_{1-b}N$. The results are shown in the column "b" in Table 1.

<Measurement of Composition of Underlayer and Composition of Surface Layer>

On the cutting tool of each sample, compositions of the underlayer and the surface layer were determined by the method described in Embodiment 1. The results are shown in the columns "Composition" of "Underlayer" and "Composition" of "Surface layer" in Table 2. A case where "-" is described in the column "Composition" of "Underlayer" in Table 2 indicates that the underlayer is absent, and a case where "-" is described in the column "Composition" of "Surface layer" indicates that the surface layer is absent.

<Measurement of Number of Stacking>

The number of stacking of each of the first unit layers and second unit layers in the cutting tool of each sample was determined by the method described in Embodiment 1. For example, the number of stacking of 10 represents that the alternate layer includes 10 first unit layers and 10 second unit layers. The obtained results are each shown in the column "Number of stacking" in Table 1.

<Measurement of Average Thickness of First Unit Layers, Average Thickness of Second Unit Layers, Thickness of First Layer, Thickness of Underlayer, and Thickness of Surface Layer>

On the cutting tool of each sample, an average thickness of the first unit layers, an average thickness of the second unit layers, a thickness of the first layer, a thickness of the underlayer, and a thickness of the surface layer were determined by the method described in Embodiment 1. The obtained results are shown in the columns "Average thickness [μm]" of "First unit layer", "Average thickness [μm]" of "Second unit layer", and "Thickness [μm]" of "First layer" in Table 1, and "Thickness [μm]" of "Underlayer" and "Thickness [μm]" of "Surface layer" in Table 2. A case where "-" is described indicates that the corresponding layer is absent.

<Measurement of λ2/λ1>

λ2/λ1 of the cutting tool of each sample was determined by the method described in Embodiment 1. The obtained results are shown in the column "λ2/λ1" in Table 1. In Table 1, a case where "-" is described in the column "λ2/λ1" means that at least any of the first unit layer and the second unit layer is absent.

<Measurement of Crystal Structure of First Unit Layer>

On the cutting tools of each sample in Sample 1 to Sample 19, the crystal structure of the first unit layer and the second unit layer were confirmed by XRD measurement on the first unit layer. The specific method was as described in Embodiment 1. In Sample 1 to Sample 19, it was confirmed that the first unit layer had the cubic crystal structure and the second unit layer had the cubic crystal structure.

<Measurement of Hardness of Coating>

Hardness of the coating of Sample 1 to Sample 19 was measured by the method described in Embodiment 1. The hardness of the coating of these samples was confirmed to be within a range of 30 GPa or more and 55 GPa or less.

<Measurement of Compressive Residual Stress of Coating>

In Sample 1 to Sample 19, the compressive residual stress of the coating was measured by the method described in Embodiment 1. It was confirmed that absolute values of the compressive residual stress of the coating of these samples were 6 GPa or less.

<Cutting Test 1: Continuous Turning Test>

With the cutting tool of each sample that had a CNMG120408 shape, continuous turning test was performed under the following cutting conditions to measure a time until an amount of wear on a flank face of a cutting edge reached 0.2 mm. The results are shown in the column "Cutting time [min]" of "Cutting test 1" in Table 2. A longer cutting time indicates a longer tool lifetime.

<<Cutting Conditions>>
Workpiece: Inconel 718 (HB400)
Cutting rate: 90 m/min
Feeding rate: 0.2 mm/rev
Depth of cut: 1.5 mm
Coolant: Water-soluble The cutting processing performed under the above cutting conditions corresponds to cutting processing performed under conditions of high cutting edge temperature.

The cutting tools of Sample 1 to Sample 19 correspond to Examples, and the cutting tools of Sample 101 to Sample 105 correspond to Comparative Examples. The cutting tools of Sample 1 to Sample 19 were confirmed to have a long tool lifetime compared with the cutting tools of Sample 101 to Sample 105 in the cutting processing performed under the conditions of high cutting edge temperature.

<Cutting Test 2: Milling Test>

With the cutting tool of each sample that had a SEMT13T3AGSN shape, surface milling was performed under the following cutting conditions by fitting: a center line of a plate with 150 mm in width; and a center of the cutter with <D160 mm, which was wider than the plate, to measure a cut length until an amount of wear on a flank face of a cutting edge reached 0.2 mm. The results are shown in the column "Cut length [km]" of "Cutting test 2" in Table 2. A longer cut length indicates a longer lifetime.

<<Cutting Conditions>>

Workpiece: SKD11 (HB=235)
Cutting rate: 200 m/min
Feeding rate: 0.15 mm/Edge
Axial depth of cut "ap": 1.5 mm
Radial depth of cut "ae": 150 mm
Coolant: dry The cutting processing performed under the above cutting conditions corresponds to cutting processing performed under conditions of high cutting edge temperature.

The cutting tools of Sample 1 to Sample 19 correspond to Examples, and the cutting tools of Sample 101 to Sample 105 correspond to Comparative Examples. The cutting tools of Sample 1 to Sample 19 were confirmed to have a long tool lifetime compared with the cutting tools of Sample 101 to Sample 105 in the cutting processing performed under the conditions of high cutting edge temperature.

Example 2

<Sample 51 to Sample 85 and Sample 151 to Sample 176>
<<Production of Cutting Tool>>

A base of a cutting tool of each sample was prepared by the same method as in Example 1. In a state where the base was rotated at a center, while introducing argon and nitrogen as reaction gasses and holding a base temperature at 600° C., a reaction gas pressure at 2.0 Pa, and the voltage of bias power source 110 at a predetermined constant value within a range of −50 V to −200 V, arc current at 100 A was each supplied to cathodes 106 and 107 to generate metal ions from cathodes 106 and 107 and an underlayer and a second layer that had compositions shown in Table 3 to Table 6 were formed on the base. The composition of cathode 106 was regulated so as to obtain the composition of the first unit layer in Table 3 to Table 4. The composition of cathode 107 was regulated so as to obtain the composition of the third unit layer in Table 3 to Table 4. A composition of cathode 120 was adjusted to obtain a composition of the surface layer in Table 5 and Table 6.

When the underlayer was formed, the second layer was formed by alternately stacking each of the first unit layers and the third unit layers one by one on the underlayer with the number of stacking shown in Table 3 and Table 4. When the underlayer was not formed, the second layer was formed by alternately stacking each of the first unit layers and the third unit layers one by one on the base with the number of stacking shown in Table 3 and Table 4. The thickness of the underlayer, thickness and the number of stacking of each of the first unit layers and the third unit layers in the second layer were regulated by a rotation speed of the base. At a time when the thicknesses of the underlayer and the second layer reached the thicknesses shown in Table 3 to Table 6, current supplied to the evaporation source was stopped. The description "-" in the column "Underlayer" in Table 5 and Table 6 represents that the underlayer is absent.

Then, while introducing nitrogen gas and oxygen gas as reaction gasses into chamber 101 and holding a base temperature at 350° C., a reaction gas pressure at 2.0 Pa, and the voltage of bias power source 110 at −350 V, arc current at 100 A was supplied to cathode 120 to generate metal ions from cathode 120 and a surface layer was formed on the second layer. At a time when the thickness of the surface layer reached the thickness shown in Table 5 and Table 6, current supplied to the evaporation source was stopped. Amounts of introduced nitrogen gas and oxygen gas were regulated so as to obtain a composition of the surface layer in Table 5 and Table 6. As above, the cutting tool of each sample was produced. The description "-" in the column "Surface layer" in Table 5 and Table 6 represents that the surface layer is absent.

TABLE 3

| | First unit layer $(Ti_{1-a}Mo_aN)$ | | Third unit layer $(Al_cCr_{1-c-d}X_dN)$ | | | | | | |
|---|---|---|---|---|---|---|---|---|---|
| Sample No. | a | Average thickness [μm] | c | d | X | Average thickness [μm] | λ3/λ1 | Number of stacking | Thickness [μm] |
| 51 | 0.01 | 0.005 | 0.40 | 0.001 | B | 0.006 | 1.2 | 300 | 3.3 |
| 52 | 0.01 | 0.005 | 0.40 | 0.05 | B | 0.007 | 1.4 | 280 | 3.4 |
| 53 | 0.04 | 0.004 | 0.60 | 0.03 | B | 0.008 | 2.0 | 260 | 3.1 |
| 54 | 0.10 | 0.006 | 0.70 | 0.001 | B | 0.020 | 3.3 | 140 | 3.6 |
| 55 | 0.20 | 0.010 | 0.80 | 0.05 | B | 0.050 | 5.0 | 50 | 3.0 |
| 56 | 0.01 | 0.015 | 0.40 | 0.010 | Si | 0.019 | 1.3 | 190 | 6.5 |
| 57 | 0.06 | 0.050 | 0.60 | 0.05 | Si | 0.060 | 1.2 | 100 | 11.0 |
| 58 | 0.12 | 0.100 | 0.70 | 0.010 | Si | 0.100 | 1.0 | 15 | 3.0 |
| 59 | 0.20 | 0.150 | 0.80 | 0.05 | Si | 0.180 | 1.2 | 10 | 3.3 |
| 60 | 0.01 | 0.006 | 0.40 | 0.001 | Sc | 0.013 | 2.2 | 200 | 3.8 |
| 61 | 0.08 | 0.007 | 0.60 | 0.05 | Sc | 0.024 | 3.4 | 100 | 3.1 |
| 62 | 0.14 | 0.008 | 0.70 | 0.001 | Sc | 0.010 | 1.3 | 150 | 2.7 |
| 63 | 0.20 | 0.005 | 0.80 | 0.05 | So | 0.006 | 1.2 | 250 | 2.8 |
| 64 | 0.01 | 0.005 | 0.40 | 0.001 | Y | 0.007 | 1.4 | 250 | 3.0 |
| 65 | 0.10 | 0.006 | 0.60 | 0.05 | Y | 0.008 | 1.3 | 250 | 3.5 |

TABLE 3-continued

| | First unit layer (Ti$_{1-a}$Mo$_a$N) | | Third unit layer (Al$_c$Cr$_{1-c-d}$X$_d$N) | | | | | | |
|---|---|---|---|---|---|---|---|---|---|
| Sample No. | a | Average thickness [μm] | c | d | X | Average thickness [μm] | λ3/λ1 | Number of stacking | Thickness [μm] |
| 66 | 0.16 | 0.005 | 0.70 | 0.001 | Y | 0.005 | 1.0 | 300 | 3.0 |
| 67 | 0.20 | 0.007 | 0.80 | 0.05 | Y | 0.009 | 1.3 | 220 | 3.5 |
| 68 | 0.01 | 0.005 | 0.40 | 0.001 | Ce | 0.015 | 3.0 | 180 | 3.6 |
| 69 | 0.12 | 0.005 | 0.60 | 0.05 | Ce | 0.020 | 4.0 | 110 | 2.8 |
| 70 | 0.18 | 0.006 | 0.70 | 0.001 | Ce | 0.008 | 1.3 | 250 | 3.5 |
| 71 | 0.20 | 0.006 | 0.80 | 0.05 | Ce | 0.012 | 2.0 | 200 | 3.6 |
| 72 | 0.05 | 0.006 | 0.40 | 0.03 | B, Si | 0.004 | 0.7 | 300 | 3.0 |
| 73 | 0.10 | 0.005 | 0.40 | 0.02 | Sc, Y | 0.005 | 1.0 | 280 | 2.8 |
| 74 | 0.12 | 0.005 | 0.50 | 0.03 | Y | 0.013 | 2.5 | 200 | 3.5 |
| 75 | 0.15 | 0.005 | 0.60 | 0.03 | Ce | 0.025 | 5.0 | 100 | 3.0 |
| 76 | 0.05 | 0.005 | 0.65 | 0.03 | La | 0.030 | 6.0 | 80 | 2.8 |
| 77 | 0.10 | 0.001 | 0.70 | 0.02 | Si | 0.004 | 4.0 | 600 | 3.0 |
| 78 | 0.12 | 0.002 | 0.80 | 0.03 | B | 0.002 | 1.0 | 800 | 3.2 |
| 79 | 0.15 | 0.200 | 0.50 | 0.001 | Y | 0.200 | 1.0 | 10 | 4.0 |
| 80 | 0.05 | 0.300 | 0.55 | 0.02 | Ce | 0.200 | 0.7 | 10 | 5.0 |
| 81 | 0.10 | 0.050 | 0.55 | 0.02 | La | 0.060 | 1.2 | 30 | 3.3 |
| 82 | 0.12 | 0.100 | 0.60 | 0.02 | Si | 0.120 | 1.2 | 15 | 3.3 |
| 83 | 0.15 | 0.150 | 0.50 | 0.03 | B | 0.180 | 1.2 | 10 | 3.3 |
| 84 | 0.05 | 0.030 | 0.55 | 0.03 | Y | 0.090 | 3.0 | 4 | 0.5 |
| 85 | 0.10 | 0.070 | 0.50 | 0.001 | Ce | 0.090 | 1.3 | 94 | 15.0 |

TABLE 4

| | First unit layer (Ti$_{1-a}$Mo$_a$N) | | Third unit layer (Al$_c$Cr$_{1-c-d}$X$_d$N) | | | | | | |
|---|---|---|---|---|---|---|---|---|---|
| Sample No. | a | Average thickness [μm] | c | d | X | Average thickness [μm] | λ3/λ1 | Number of stacking | Thickness [μm] |
| 151 | 0.005 | 0.005 | 0.40 | 0.001 | B | 0.006 | 1.2 | 300 | 3.3 |
| 152 | 0.25 | 0.010 | 0.80 | 0.05 | B | 0.050 | 5.0 | 50 | 3.0 |
| 153 | 0.01 | 0.005 | 0.30 | 0.06 | B | 0.006 | 1.2 | 300 | 3.3 |
| 154 | 0.20 | 0.010 | 0.90 | 0.06 | B | 0.050 | 5.0 | 50 | 3.0 |
| 155 | 0.005 | 0.006 | 0.40 | 0.001 | Sc | 0.013 | 2.2 | 200 | 3.8 |
| 156 | 0.25 | 0.005 | 0.80 | 0.05 | Sc | 0.006 | 1.2 | 250 | 2.8 |
| 157 | 0.01 | 0.006 | 0.30 | 0.06 | Sc | 0.013 | 2.2 | 200 | 3.8 |
| 158 | 0.01 | 0.006 | 0.90 | 0.06 | Sc | 0.013 | 2.2 | 200 | 3.8 |
| 159 | 0.20 | 0.005 | 0.30 | 0.06 | Sc | 0.006 | 1.2 | 250 | 2.8 |
| 160 | 0.20 | 0.150 | 0.90 | 0.05 | Si | 0.180 | 1.2 | 10 | 3.3 |
| 161 | 0.005 | 0.015 | 0.40 | 0.01 | Si | 0.019 | 1.3 | 190 | 6.5 |
| 162 | 0.25 | 0.050 | 0.60 | 0.05 | Si | 0.060 | 1.2 | 100 | 11.0 |
| 163 | 0.01 | 0.005 | 0.30 | 0.06 | Y | 0.007 | 1.4 | 250 | 3.0 |
| 164 | 0.20 | 0.007 | 0.90 | 0.05 | Y | 0.009 | 1.3 | 220 | 3.5 |
| 165 | 0.005 | 0.005 | 0.40 | 0.001 | Y | 0.007 | 1.4 | 250 | 3.0 |
| 166 | 0.25 | 0.007 | 0.80 | 0.05 | Y | 0.009 | 1.3 | 220 | 3.5 |
| 167 | 0.005 | 0.005 | 0.40 | 0.001 | Ce | 0.015 | 3.0 | 180 | 3.6 |
| 168 | 0.25 | 0.006 | 0.80 | 0.05 | Ce | 0.012 | 2.0 | 200 | 3.6 |
| 169 | 0.01 | 0.005 | 0.30 | 0.06 | Ce | 0.015 | 3.0 | 180 | 3.6 |
| 170 | 0.20 | 0.006 | 0.90 | 0.05 | Ce | 0.012 | 2.0 | 200 | 3.6 |
| 172 | — | — | 0.60 | 0.03 | B | 3.100 | — | — | 3.1 |
| 173 | — | — | 0.80 | 0.05 | Si | 3.300 | — | — | 3.3 |
| 174 | — | — | 0.60 | 0.05 | Sc | 3.100 | — | — | 3.1 |
| 175 | — | — | 0.60 | 0.05 | Y | 3.500 | — | — | 3.5 |
| 176 | — | — | 0.60 | 0.05 | Ce | 2.800 | — | — | 2.8 |

TABLE 5

| Sample No. | Underlayer Composition | Underlayer Thickness [μm] | Surface layer Composition | Surface layer Thickness [μm] | Thickness of coating [μm] | Cutting test 3 Cutting time [min] | Cutting test 4 Cutting distance [km] |
|---|---|---|---|---|---|---|---|
| 51 | — | — | — | — | 3.3 | 71 | 7.0 |
| 52 | — | — | — | — | 3.4 | 76 | 7.1 |
| 53 | — | — | — | — | 3.1 | 73 | 7.2 |
| 54 | — | — | — | — | 3.6 | 72 | 7.3 |
| 55 | — | — | — | — | 3.0 | 70 | 7.0 |
| 56 | — | — | — | — | 6.5 | 103 | 9.2 |
| 57 | — | — | — | — | 11.0 | 106 | 9.6 |
| 58 | — | — | — | — | 3.0 | 75 | 9.0 |
| 59 | — | — | — | — | 3.3 | 81 | 8.3 |
| 60 | — | — | — | — | 3.8 | 74 | 7.8 |
| 61 | — | — | — | — | 3.1 | 88 | 8.5 |
| 62 | — | — | — | — | 2.7 | 80 | 8.2 |
| 63 | — | — | — | — | 2.8 | 79 | 8.0 |
| 64 | — | — | — | — | 3.0 | 72 | 7.2 |
| 65 | — | — | — | — | 3.5 | 75 | 7.6 |
| 66 | — | — | — | — | 3.0 | 70 | 7.1 |
| 67 | — | — | — | — | 3.5 | 75 | 7.5 |
| 68 | — | — | — | — | 3.6 | 81 | 8.0 |
| 69 | — | — | — | — | 2.8 | 73 | 7.5 |
| 70 | — | — | — | — | 3.5 | 76 | 7.7 |
| 71 | — | — | — | — | 3.6 | 79 | 7.8 |
| 72 | — | — | — | — | 3.0 | 85 | 8.6 |
| 73 | — | — | — | — | 2.8 | 75 | 7.6 |
| 74 | — | — | — | — | 3.5 | 78 | 7.7 |
| 75 | — | — | — | — | 3.0 | 83 | 8.3 |
| 76 | — | — | — | — | 2.8 | 80 | 8.1 |
| 77 | — | — | — | — | 3.0 | 71 | 7.0 |
| 78 | — | — | — | — | 3.2 | 72 | 7.3 |
| 79 | TiMoN | 0.6 | — | — | 4.6 | 90 | 8.6 |
| 80 | — | — | — | — | 5.0 | 95 | 9.0 |
| 81 | AlCrLaN | 0.5 | — | — | 3.8 | 85 | 8.4 |
| 82 | — | — | TiMoON | 0.5 | 3.8 | 83 | 8.2 |
| 83 | AlCrBN | 0.7 | AlCrBON | 0.6 | 4.6 | 92 | 8.8 |
| 84 | — | — | — | — | 0.5 | 59 | 5.2 |
| 85 | — | — | — | — | 15.0 | 109 | 9.9 |

TABLE 6

| Sample No. | Underlayer Composition | Underlayer Thickness [μm] | Surface layer Composition | Surface layer Thickness [μm] | Thickness of coating [μm] | Cutting test 3 Cutting time [min] | Cutting test 4 Cutting distance [km] |
|---|---|---|---|---|---|---|---|
| 151 | — | — | — | — | 3.3 | 20 | 1.9 |
| 152 | — | — | — | — | 3.0 | 22 | 1.9 |
| 153 | — | — | — | — | 3.3 | 22 | 1.8 |
| 154 | — | — | — | — | 3.0 | 20 | 1.9 |
| 155 | — | — | — | — | 3.8 | 21 | 2.0 |
| 156 | — | — | — | — | 2.8 | 18 | 1.9 |
| 157 | — | — | — | — | 3.8 | 23 | 2.1 |
| 158 | — | — | — | — | 3.8 | 22 | 2.0 |
| 159 | — | — | — | — | 2.8 | 20 | 1.8 |
| 160 | — | — | — | — | 3.3 | 23 | 1.9 |
| 161 | — | — | — | — | 6.5 | 25 | 2.3 |
| 162 | — | — | — | — | 11.0 | 30 | 2.5 |
| 163 | — | — | — | — | 3.0 | 21 | 1.9 |
| 164 | — | — | — | — | 3.5 | 23 | 2.1 |
| 165 | — | — | — | — | 3.0 | 20 | 1.9 |
| 166 | — | — | — | — | 3.5 | 21 | 1.8 |
| 167 | — | — | — | — | 3.6 | 21 | 1.8 |
| 168 | — | — | — | — | 3.6 | 23 | 2.0 |
| 169 | — | — | — | — | 3.6 | 20 | 1.9 |
| 170 | — | — | — | — | 3.6 | 21 | 1.8 |

TABLE 6-continued

| Sample No. | Underlayer Composition | Thickness [μm] | Surface layer Composition | Thickness [μm] | Thickness of coating [μm] | Cutting test 3 Cutting time [min] | Cutting test 4 Cutting distance [km] |
|---|---|---|---|---|---|---|---|
| 172 | — | — | — | — | 3.1 | 18 | 1.6 |
| 173 | — | — | — | — | 3.3 | 19 | 1.8 |
| 174 | — | — | — | — | 3.1 | 17 | 1.6 |
| 175 | — | — | — | — | 3.5 | 17 | 1.6 |
| 176 | — | — | — | — | 2.8 | 18 | 1.7 |

<<Evaluation>>

On the cutting tools according to each sample, the composition of the first unit layer, the composition of the third unit layer, the composition of the underlayer, the composition of the surface layer, each of the numbers of stacking of the first unit layers and the third unit layers, the average thickness of the first unit layers, the average thickness of the third unit layers, the thickness of the second layer, the thickness of the underlayer, the thickness of the surface layer, λ3/λ1, the crystal structure of the first unit layer, the hardness of the coating, and the compressive residual stress of the coating were measured. A measurement method of each item is as described in Example 1. The results are shown in Table 3 to Table 6.

In Sample 51 to Sample 85, it was confirmed that the first unit layer had the cubic crystal structure and the second unit layer had the cubic crystal structure. It was confirmed that the hardness of the coating of Sample 51 to Sample 85 was within a range of 30 GPa or more and 55 GPa or less. It was confirmed that absolute values of the compressive residual stress of the coating of Sample 51 to Sample 85 were 6 GPa or less.

<Cutting Test 3: Continuous Turning Test>

With the cutting tool of each sample that had a CNMG120408 shape, continuous turning test was performed under the following cutting conditions to measure a time until an amount of wear on a flank face of a cutting edge reached 0.2 mm. The results are shown in the column "Cutting time [min]" of "Cutting test 3" in Table 5 to Table 6. A longer cutting time indicates a longer tool lifetime.

(Cutting Conditions)
Workpiece: SCM440 (HB320)
Cutting rate: 360 m/min
Feeding rate: 0.35 mm/rev
Depth of cut: 2.0 mm
Coolant: Water-soluble The cutting processing performed under the above cutting conditions corresponds to cutting processing performed under conditions of high cutting edge temperature.

The cutting tools of Sample 51 to Sample 85 correspond to Examples, and the cutting tools of Sample 151 to Sample 176 correspond to Comparative Examples. The cutting tools of Sample 51 to Sample 85 were confirmed to have a long tool lifetime compared with the cutting tools of Sample 151 to Sample 176 in the cutting processing performed under the conditions of high cutting edge temperature.

<Cutting Test 4: Milling Test>

With the cutting tool of each sample that had a SEMT13T3AGSN shape, surface milling was performed under the following cutting conditions by fitting: a center line of a plate with 150 mm in width; and a center of the cutter with Φ160 mm, which was wider than the plate, to measure a cut length until an amount of wear on a flank face of a cutting edge reached 0.2 mm. The results are shown in the column "Cut length [km]" of "Cutting test 4" in Table 5 to Table 6. A longer cut length indicates a longer lifetime.

<<Cutting Conditions>>
Workpiece: FCD700 (HB=250)
Cutting rate: 220 m/min
Feeding rate: 0.2 mm/Edge
Axial depth of cut "ap": 2.0 mm
Radial depth of cut "ae": 150 mm
Coolant: dry The cutting processing performed under the above cutting conditions corresponds to cutting processing performed under conditions of high cutting edge temperature.

The cutting tools of Sample 51 to Sample 85 correspond to Examples, and the cutting tools of Sample 151 to Sample 176 correspond to Comparative Examples. The cutting tools of Sample 51 to Sample 85 were confirmed to have a long tool lifetime compared with the cutting tools of Sample 151 to Sample 176 in the cutting processing performed under the conditions of high cutting edge temperature.

The embodiments and Examples of the present disclosure have been described as above, but it is anticipated in advance that the aforementioned constitution of embodiments and Examples are appropriately combined or variously modified.

The embodiments and Examples disclosed herein are examples in all points, and should not be limitative. The scope of the present invention is determined by not the above embodiments nor Examples but claims, and intended to include meaning equivalent to claims and all modification within the scope.

REFERENCE SIGNS LIST

1 Cutting tool; 2 Base; 3 Coating; 12 First unit layer; 13 First layer; 13A Second layer; 14 Surface layer; 15 Second unit layer; 16 Underlayer; 17 Third unit layer; 101 Chamber; 102 Gas; 103 Gas discharging port; 104 Base holder; 105 Gas introducing port; 106, 107, 120 Cathode; 108, 109 Arc power source; 110 Bias power source.

The invention claimed is:

1. A cutting tool, comprising:
a base; and
a coating disposed on the base, wherein
the coating includes a first layer,
the first layer is composed of an alternate layer in which a first unit layer and a second unit layer are alternately stacked,
the first unit layer is composed of $Ti_{1-a}Mo_aN$,
a represents 0.01 or more and 0.20 or less,
the second unit layer is composed of $Al_bCr_{1-b}N$, and
b represents 0.40 or more and 0.80 or less.

2. The cutting tool according to claim 1, wherein in the first unit layer and the second unit layer adjacent to the first unit layer, a ratio λ2/λ1 of a thickness λ2 μm of the second unit layer to a thickness λ1 μm of the first unit layer is 1.0 or more and 5.0 or less.

3. The cutting tool according to claim 1, wherein
an average thickness of the first unit layer is 0.002 μm or more and 0.2 μm or less, and
an average thickness of the second unit layer is 0.002 μm or more and 0.2 μm or less.

4. The cutting tool according to claim 1, wherein
the coating further includes a surface layer provided on a side opposite to the base of the first layer, and
the surface layer is composed of TiMoON or AlCrON.

5. A cutting tool, comprising:
a base; and
a coating disposed on the base, wherein
the coating includes a second layer,
the second layer is composed of an alternate layer in which a first unit layer and a third unit layer are alternately stacked,
the first unit layer is composed of $Ti_{1-a}Mo_aN$,
a represents 0.01 or more and 0.20 or less,
the third unit layer is composed of $Al_cCr_{1-c-d}X_dN$,
X represents one or two selected from the group consisting of boron, silicon, scandium, yttrium, and cerium,
c represents 0.40 or more and 0.80 or less, and
d represents 0.001 or more and 0.05 or less.

6. The cutting tool according to claim 5, wherein in the first unit layer and the third unit layer adjacent to the first unit layer, a ratio λ3/λ1 of a thickness λ3 μm of the third unit layer to a thickness λ1 μm of the first unit layer is 1.0 or more and 5.0 or less.

7. The cutting tool according to claim 5, wherein
an average thickness of the first unit layer is 0.002 μm or more and 0.2 μm or less, and
an average thickness of the third unit layer is 0.002 μm or more and 0.2 μm or less.

8. The cutting tool according to claim 5, wherein
the coating further includes a surface layer provided on a side opposite to the base of the second layer,
the surface layer is composed of TiMoON or AlCrXON, and
X represents one or two selected from the group consisting of boron, silicon, scandium, yttrium, and cerium.

* * * * *